United States Patent
Huang et al.

(10) Patent No.: US 9,661,889 B1
(45) Date of Patent: May 30, 2017

(54) HEAD-MOUNTED DISPLAY DEVICE

(71) Applicant: Coretronic Corporation, Hsin-Chu (TW)

(72) Inventors: Wei-Cheng Huang, Hsin-Chu (TW); Chin-Sheng Chao, Hsin-Chu (TW); Chun-Yao Chen, Hsin-Chu (TW); Ming-Chen Liu, Hsin-Chu (TW); Chih-Lung Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 15/214,428

(22) Filed: Jul. 19, 2016

(30) Foreign Application Priority Data

Nov. 30, 2015 (TW) .............................. 104219191 U

(51) Int. Cl.
| | |
|---|---|
| G02B 27/14 | (2006.01) |
| A42B 1/24 | (2006.01) |
| A42B 3/04 | (2006.01) |
| H05K 5/00 | (2006.01) |

(52) U.S. Cl.
CPC .............. *A42B 1/245* (2013.01); *A42B 3/042* (2013.01); *H05K 5/0017* (2013.01); *H05K 5/0086* (2013.01)

(58) Field of Classification Search
CPC .................................................... A42B 1/245
USPC .................................................. 359/809, 630
See application file for complete search history.

(56) References Cited

U.S. PATENT DOCUMENTS 6,369,952 B1 * 4/2002 Rallison et al. ...... G02B 27/017
359/630

FOREIGN PATENT DOCUMENTS

| CN | 2407605 | 11/2000 |
|---|---|---|
| CN | 201268356 | 7/2009 |
| CN | 204101814 | 1/2015 |
| TW | 514058 | 12/2002 |

* cited by examiner

*Primary Examiner* — James Jones
(74) *Attorney, Agent, or Firm* — Jianq Chyun IP Office

(57) ABSTRACT

A head-mounted display device includes a belt body, a buckle assembly disposed on the belt body, and an electronic module disposed on the buckle assembly. The buckle assembly includes a base movably fixed to the belt body and a cover detachably disposed on the base. One of the base and the cover includes a sliding rail while the other includes a sliding member. One of the base and the cover includes an arm and a hook protruding from the arm while the other includes an engaging indent. The electronic module including a display module is disposed on the cover. The hook is engaged with the engaging indent so that the cover is fixed to the base.

12 Claims, 5 Drawing Sheets

HEAD-MOUNTED DISPLAY DEVICE

CROSS-REFERENCE TO RELATED APPLICATION

This application claims the priority benefit of Taiwan application serial no. 104219191, filed on Nov. 30, 2015. The entirety of the above-mentioned patent application is hereby incorporated by reference herein and made a part of this specification.

BACKGROUND OF THE INVENTION

Field of the Invention

The invention relates to a display device and more particularly relates to a head-mounted display device.

Description of Related Art

With the rapid development of technology, products that integrate head-mounted devices with electronic modules have been developed in recent years for the user to wear the electronic modules on the head or other parts of the body. For example, a head-mounted electronic device may be equipped with various electronic modules (e.g. a display module and a lens module) that are fixed to a belt body respectively at positions close to the user's left and right eyes for displaying images to the user's eyes and recording the view before the user. Some users may prefer using left eye to watch the images displayed by the display module while other users may prefer using right eye. To cope with such demand, head-mounted display devices with two different specifications are required for disposing the display device on the left and right sides. However, neither of them is suitable for all the users.

Since the display module and the lens module are fixed to the belt body by locking, it is inconvenient for the user to remove the display module and the lens module or switch their positions. The installation also takes more time. In addition, after the positions of the display module and the lens module are switched, the display module may not be properly aligned with the user's eye and consequently the user may see lopsided or incomplete images.

The information disclosed in this "Description of Related Art" section is only for enhancement of understanding of the background of the described technology and therefore it may contain information that does not form the prior art that is already known to a person of ordinary skill in the art. Further, the information disclosed in the "Description of Related Art" section does not mean that one or more problems to be resolved by one or more embodiments of the invention were acknowledged by a person of ordinary skill in the art.

SUMMARY OF THE INVENTION

The invention provides a head-mounted display device for quickly removing and installing an electronic module.

Other features and advantages of the invention can be further illustrated by the technical features broadly embodied and described as follows.

In view of one, part of, or all of the aforementioned or other features, an embodiment of the invention provides a head-mounted display device that includes a belt body, at least one buckle assembly disposed on the belt body, and at least one electronic module. Each buckle assembly includes a base and a cover, wherein the base is movably fixed to the belt body and the cover is detachably disposed on the base. One of the base and the cover includes at least one sliding rail while the other includes at least one sliding member corresponding to the at least one sliding rail, such that the cover is slidably disposed on the base. One of the base and the cover includes an arm and a hook protruding from the arm while the other includes an engaging indent corresponding to the hook. The at least one electronic module is fixed to the at least one buckle assembly, and each of the at least one electronic module is disposed on the corresponding cover. The electronic module includes a display module, and the hook is engaged with the engaging indent to fix the cover to the base, so as to fix the electronic module to the belt body. When the arm is bent and the hook is disengaged from the engaging indent, the cover is detached from the base, so as to separate the corresponding electronic module from the belt body.

Based on the above, the embodiments of the invention achieve at least one of the following advantages or effects. The base of the head-mounted display device of the invention is movably fixed to the belt body. The electronic module is disposed on the cover and the hook is engaged with the engaging indent to fix the cover to the base, so as to fix the electronic module to the belt body. To separate the electronic module from the belt body, the user may bend the arm to disengage the hook from the engaging indent, so as to detach the cover from the base. Accordingly, the user may decide the position of the base on the belt body as desired, and may also decide whether to dispose the electronic module with the cover to the base near the left side or the right side. Moreover, the cover may be detached from or installed to the base easily and quickly.

Other objectives, features and advantages of the invention may be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
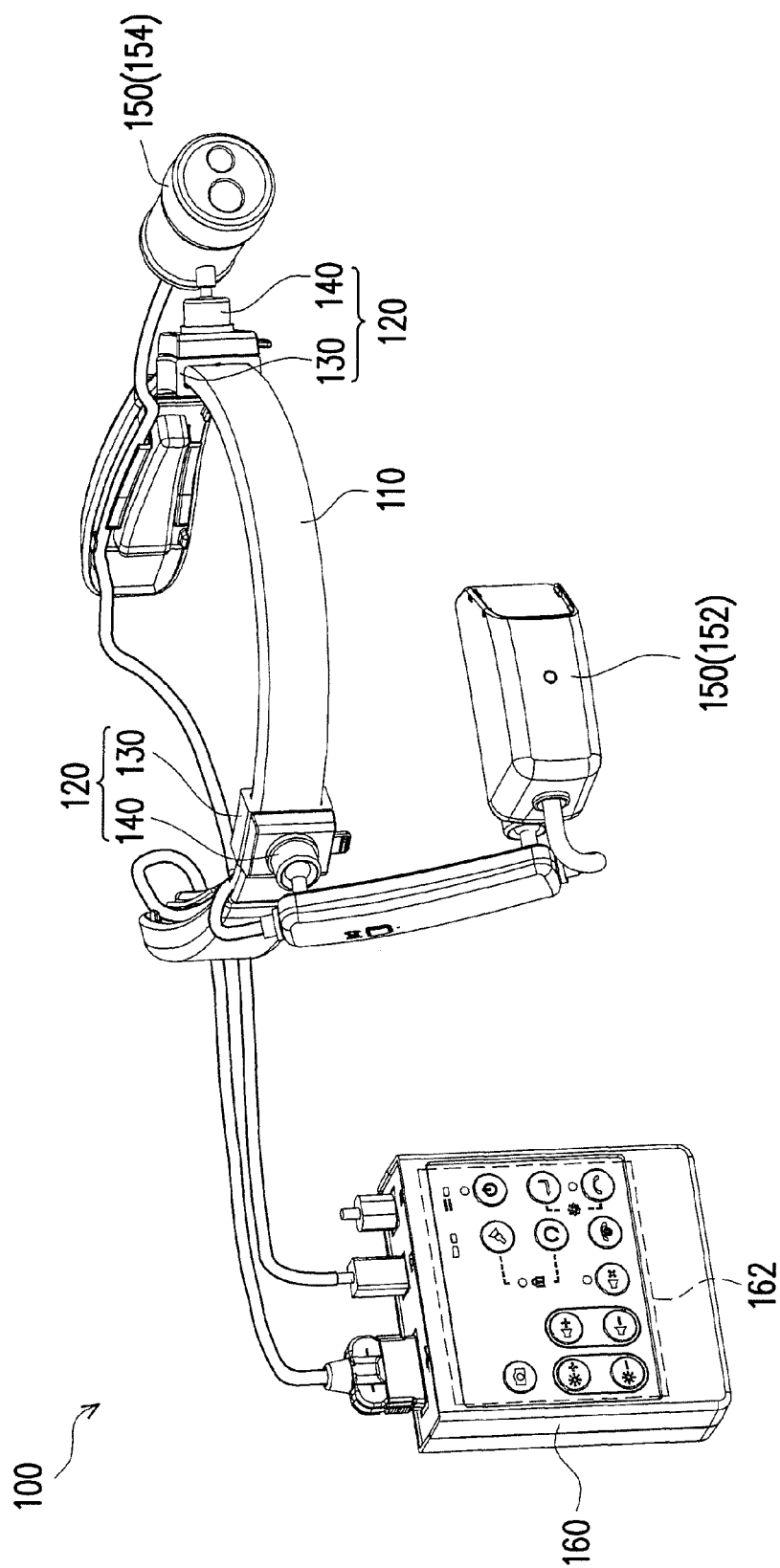
FIG. 1 is a schematic view of a head-mounted display device according to an embodiment of the invention.

FIG. 1 is a schematic view of a head-mounted display device according to an embodiment of the invention. Referring to FIG. 1, a head-mounted display device 100 of this embodiment includes a belt body 110, at least one buckle assembly 120 disposed on the belt body 110, at least one electronic module 150, and a control box 160. In this embodiment, the head-mounted display device 100 includes two buckle assemblies 120 adapted to be disposed on two opposite sides of the belt body 110 and two electronic modules 150 respectively disposed on the two buckle assemblies 120. Nevertheless, the invention is not limited thereto, and it is possible to use one single electronic module 150 depending on the situations.

Each buckle assembly 120 includes a base 130 and a cover 140. The base 130 is movably fixed to the belt body 110 and the cover 140 is detachably disposed on the base 130. One of the electronic modules 150 includes a display module 152 and a lens module 154. The display module 152 and the lens module 154 are respectively fixed to the two covers 140. The display module 152 may be a DMD light valve or LCD panel for displaying images, but not limited. The control box 160 includes a control circuit 162 and is electrically connected with the electronic modules 150 for operating the two electronic modules 150 through the control circuit 162. The lens module 154 may be a device for capturing the view before the head-mounted display device 100, such as a video camera; and the display module 152 may be a device for displaying an image before the user's eye, such as a virtual imaging device that projects an image to the user's eye or an imaging device that directly displays an image on a screen in the display module 152. In other embodiments, the types of the display module 152 and the lens module 154 are not particularly limited.

In this embodiment, the user may decide the position of the base 130 on the belt body 110 as desired and may easily and quickly remove or install different electronic modules 150 with the covers 140 from or to the base 130. In this embodiment, the display module 152 and the lens module 154 with the corresponding covers 140 may be installed to the bases 130 on different sides. For example, if the user wishes to see the image through the right eye, the display module 152 with the corresponding cover 140 may be installed to the base 130 on the right side quickly. A detailed structure of the head-mounted display device 100 is described hereinafter.

Figure 2:
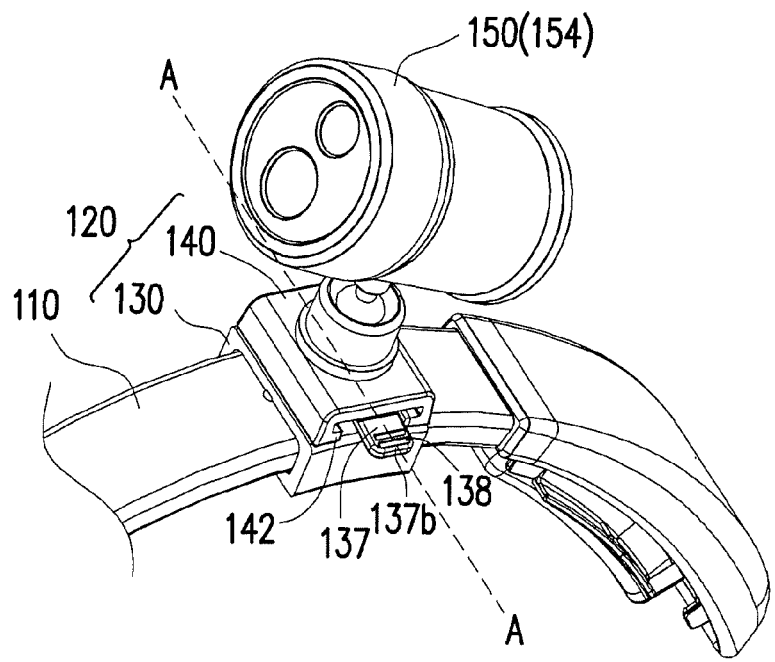
FIG. 2 is a schematic view of a part of the head-mounted display device in FIG. 1.
Figure 3:
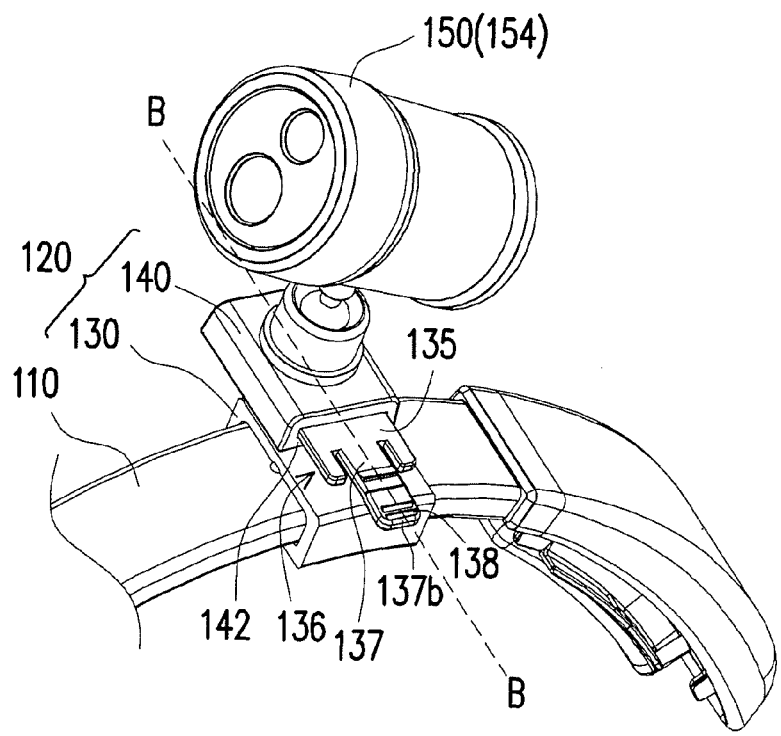
FIG. 3 is a schematic view of a cover sliding out of a base in FIG. 2.
Figure 4:
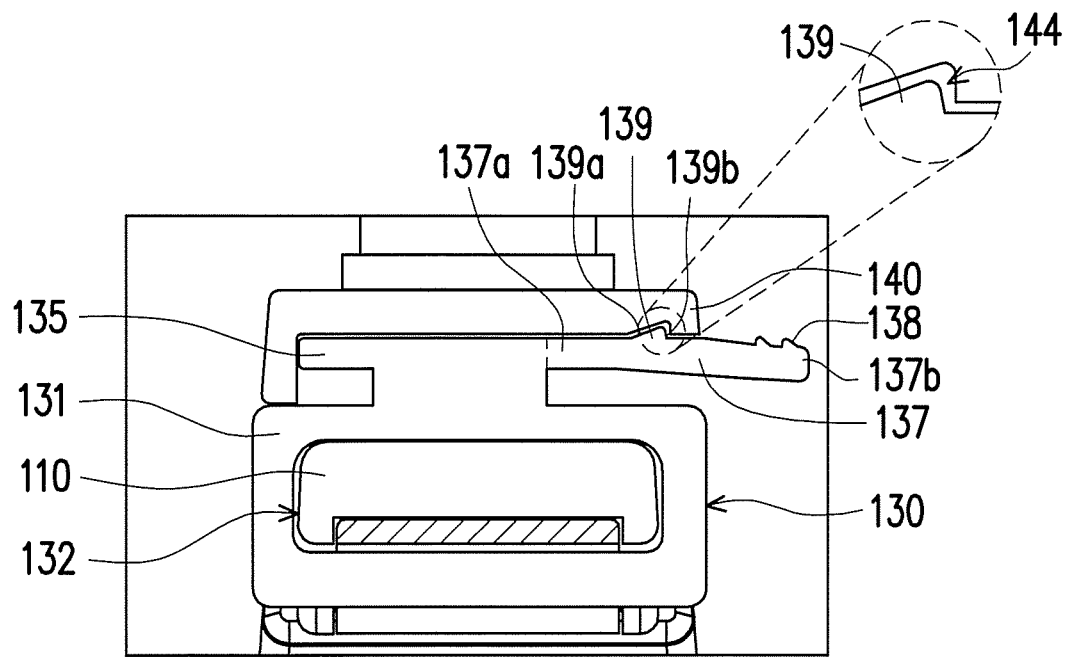
FIG. 4 is a schematic cross-sectional view along the line A-A of FIG. 2.
Figure 5:
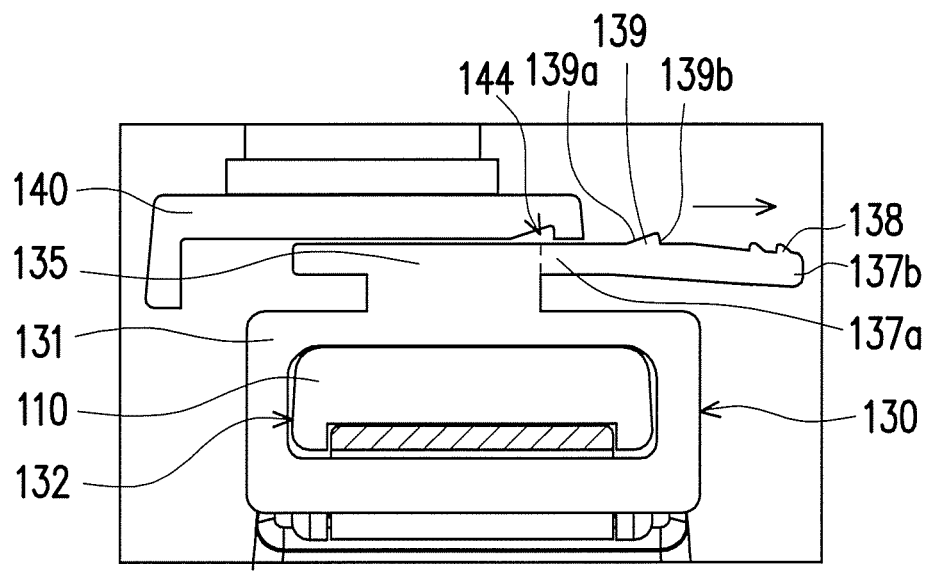
FIG. 5 is a schematic cross-sectional view along the line B-B of FIG. 3.

FIG. 2 is a schematic view of a part of the head-mounted display device in FIG. 1. FIG. 3 is a schematic view of the cover sliding out of the base in FIG. 2. FIG. 4 is a schematic cross-sectional view along the line A-A of FIG. 2. FIG. 5 is a schematic cross-sectional view along the line B-B of FIG. 3. Referring to FIG. 2 to FIG. 5, one of the base 130 and the cover 140 includes at least one sliding rail 136 while the other includes at least one sliding member 142 corresponding to the at least one sliding rail 136, such that the cover 140 is adapted to be slidably disposed on the base 130, as shown in FIG. 2 and FIG. 3.

Specifically, in this embodiment, the base 130 includes a base part 131 and a protrusion part 135 that protrudes from the base part 131. The base part 131 is movably fixed to the belt body 110. Two opposite side surfaces of the protrusion part 135 are recessed to form two parallel sliding rails 136. As shown in FIG. 2 and FIG. 3, the cover 140 has an "n" shape, and two opposite ends of the "n" shape extend toward each other to form two sliding members 142 to be inserted into the two sliding rails 136 respectively, such that the cover 140 is slidably disposed on the base 130. A length of extension of the sliding member 142 from the two ends may correspond to a depth of recess of the sliding rail 136, such that the sliding member 142 is engaged with the sliding rail 136 after being inserted. Nevertheless, in other embodiments, the base 130 may include the sliding member 142 and the cover 140 may include the sliding rail 136. The positions of the sliding rail 136 and the sliding member 142 are not particularly limited as long as the base 130 and the cover 140 match each other.

In addition, as shown in FIG. 4 and FIG. 5, in order to fix the cover 140 to the base 130, one of the base 130 and the cover 140 includes an arm 137 and a hook 139 that protrudes from the arm 137 while the other includes an engaging indent 144 corresponding to the hook 139. In this embodiment, the base 130 includes the aim 137 and the hook 139. The arm 137 includes a first end 137a and a second end 137b that are opposite to each other. As shown in FIG. 4, the first end 137a on the left is connected with the protrusion part 135 of the base 130 and the second end 137b on the right is suspended. The second end 137b of the arm 137 includes a plurality of pressing ridges 138 marking the area to be pressed by the user. The pressing ridges 138 also increase friction between the user's finger and the arm 137 and prevent a slip when pressed by the user's finger. The hook 139 includes a gently sloping surface 139a facing the first end 137a and a stopper surface 139b facing the second end 137b. The gently sloping surface 139a and the stopper surface 139b are connected at an end, and the hook 139 is located between the first end 137a and the pressing ridges 138 of the second end 137b. As shown in FIG. 3, a direction that the aim 137 extends from the protrusion part 135 is parallel to an extending direction of the sliding rail 136.

As shown in FIG. 3, FIG. 4, and FIG. 5, in this embodiment, the cover 140 includes an engaging indent 144 that is recessed on a surface of the "n" shape to face the sliding member 142. The hook 139 is engaged with the engaging indent 144 to fix the cover 140 to the base 130, such that the electronic module 150 is fixed to the belt body 110. As shown in FIG. 5, in order to remove the cover 140 from the base 130, the second end 137b of the arm 137 is bent to disengage the hook 139 from the engaging indent 144 and the cover 140 is pushed to move the sliding members 142 on two ends of the "n" shape of the cover 140 along the sliding rails 136 of the base 130, so as to be pushed away from the base 130, such that the electronic module 150 fixed to the cover 140 may be separated from the belt body 110. Conversely, in order to reinstall the cover 140 to the base 130, the sliding members 142 on two ends of the "n" shape of the cover 140 are slid into the two sliding rails 136 of the base 130, and at the same time, the surface of the cover 140 beside the engaging indent 144 pushes the gently sloping surface 139a of the hook 139 of the base 130 to elastically deform the arm 137 until the gently sloping surface 139a passes the surface beside the engaging indent 144 and the arm 137 elastically recovers for the hook 139 to engage with the engaging indent 144. Compared with the stopper surface 139b, the gently sloping surface 139a of the hook 139 has a smaller angle (not assigned with a reference numeral) with respect to the surface of the arm 137, by which the hook 139 is engaged with the engaging indent 144 and confined in the engaging indent 144.

Figure 6:
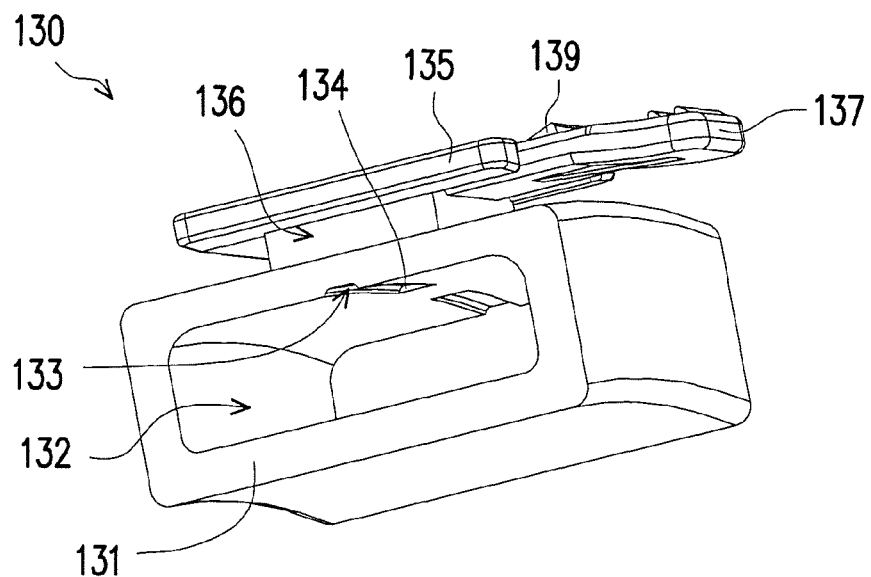
FIG. 6 is a schematic perspective view of the base of the head-mounted display device in FIG. 1.
Figure 7:
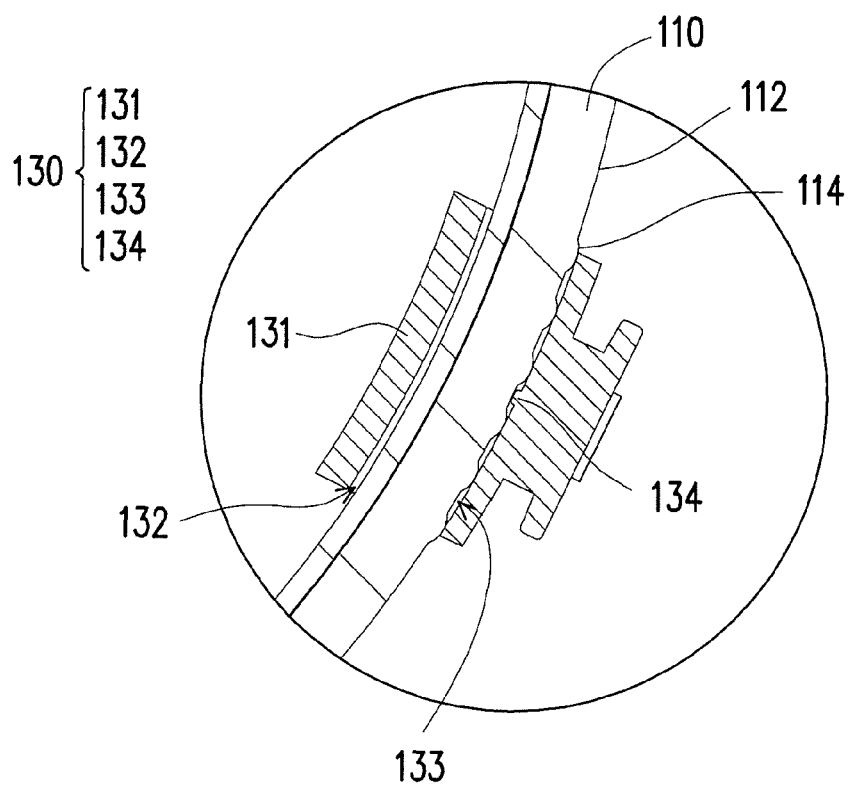
FIG. 7 is a schematic cross-sectional view of a part of a belt body and the base of the head-mounted display device in FIG. 1.

Thus, the electronic module 150 may be fixed to the base 130 on the belt body 110 through the cover 140. In addition, the position of the base 130 on the belt body 110 is adjustable so as to correspond to the position of the user's eye. FIG. 6 is a schematic perspective view of the base of the head-mounted display device in FIG. 1. FIG. 7 is a schematic cross-sectional view of a part of the belt body and the base of the head-mounted display device in FIG. 1. Referring to FIG. 6 and FIG. 7, in this embodiment, the base part 131 of the base 130 includes a through hole 132, and the belt body 110 is disposed through the through hole 132 of the base 130. The through hole 132 and the belt body 110 have shapes corresponding to each other. The belt body 110 includes a plurality of protruding ribs 114 on an outer surface 112. In this embodiment, the protruding ribs 114 on the outer surface 112 of the belt body 110 are aligned at equal intervals. Nevertheless, the invention is not limited thereto.

A sliding groove 133 is recessed on an inner surface of the through hole 132 of the base 130 corresponding to the arrangement direction of the protruding ribs 114. A bump 134 is disposed on a bottom surface of the sliding groove 133. When the base 130 slides with respect to the belt body 110, the protruding ribs 114 move in the sliding groove 133 of the base part 131. When the base 130 stops sliding, the bump 134 in the sliding groove 133 is limited by the two adjacent protruding ribs 114 on the belt body 110 and positioned between the two protruding ribs 114, such that the base 130 is fixed to a certain position on the belt body 110. Accordingly, the user may adjust the position of the base 130 on the belt body 110 as desired.

Figure 8:
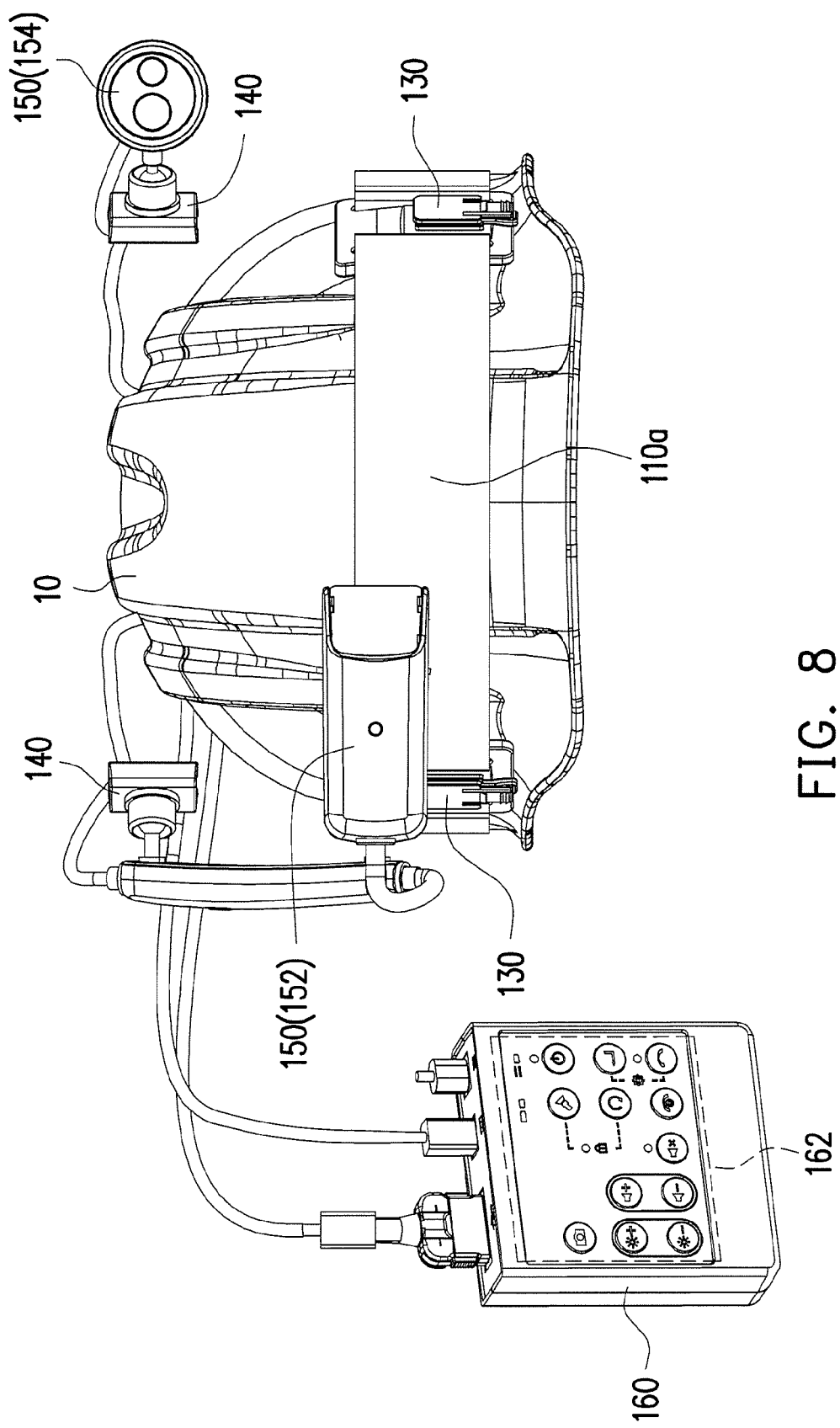
FIG. 8 is a schematic view of the head-mounted display device according to another embodiment of the invention.

It should be noted that, in this embodiment, the belt body 110 of the head-mounted display device 100 is a rigid body, which may be a ring-shaped band or a C-shaped band to be worn on the user's head. Nevertheless, the disclosure is not intended to limit the belt body 110 to a certain type. FIG. 8 is a schematic view of the head-mounted display device according to another embodiment of the invention. It should be noted that, in FIG. 8, the same or similar components are assigned with the same or similar reference numerals and thus details thereof will not be repeated. Referring to FIG. 8, in this embodiment, a belt body 110a is a soft body. Therefore, the belt body 110a may be disposed on a helmet 10, and the user may directly wear the helmet 10 to operate the electronic module 150. In other embodiments, the belt body may be a combination of a partially rigid body and a partially soft body. Nevertheless, the invention is not limited thereto.

To sum up, the embodiments of the invention achieve at least one of the following advantages or effects. The base of the head-mounted display device of the invention is movably fixed to the belt body. The electronic module is disposed on the cover and the hook is engaged with the engaging indent to fix the cover to the base, so as to fix the electronic module to the belt body. To separate the electronic module from the belt body, the user may bend the arm to disengage the hook from the engaging indent, so as to detach the cover from the base. Accordingly, the user may decide the position of the base on the belt body as desired, and may also decide whether to dispose the electronic module, which may have different functions, with the cover to the base near the left side or the right side. With use of the easy and quick buckle assembly, the electronic module may be installed to different bases according to the user's need, which is convenient. Further, the position of the base with respect to the belt body may be adjusted such that the bump in the sliding groove on the base is positioned by two adjacent protruding ribs on the belt body. Thereby, the position of the corresponding electronic module may be adjusted to improve the flexibility of use of the head-mounted display device.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A head-mounted display device, comprising:
a belt body;
at least one buckle assembly disposed on the belt body and each of the buckle assembly comprising a base and a cover, wherein the base is movably fixed to the belt body and the cover is detachably disposed on the base, wherein one of the base and the cover comprises at least one sliding rail while the other comprises at least one sliding member corresponding to the at least one sliding rail such that the cover is adapted to be slidably disposed on the base, and one of the base and the cover comprises an arm and a hook protruding from the arm while the other comprises an engaging indent corresponding to the hook; and
at least one electronic module fixed to the at least one buckle assembly and each of the electronic module being disposed on the corresponding cover, wherein the at least one electronic module comprises a display module, wherein the hook is adapted to be engaged with the engaging indent to fix the cover to the base so as to fix the at least one electronic module to the belt body, and when the arm is bent to disengage the hook from the engaging indent, the cover is adapted to be detached from the base so as to separate the corresponding at least one electronic module from the belt body.

2. The head-mounted display device according to claim 1, wherein the base comprises a base part and a protrusion part protruded from the base part, wherein two opposite side surfaces of the protrusion part are recessed to form two sliding rails and the cover has an "n" shape, and two opposite ends of the "n" shape extend toward each other to form two sliding members to be inserted into the sliding rails respectively.

3. The head-mounted display device according to claim 2, wherein the base comprises the arm comprising a first end and a second end opposite to the first end, wherein the first end is connected with the protrusion part and the cover comprises the engaging indent recessed on a surface of the "n" shape to face the sliding member.

4. The head-mounted display device according to claim 3, wherein the hook comprises a gently sloping surface facing the first end, and when the cover is adapted to slide into the base, the surface beside the engaging indent is adapted to push the gently sloping surface of the hook to deform the arm until the hook is engaged with the engaging indent and the arm recovers.

5. The head-mounted display device according to claim 3, wherein an extending direction of the arm is parallel to an extending direction of each of the sliding rails.

6. The head-mounted display device according to claim 3, wherein the arm further comprises a plurality of pressing ridges on the second end away from the protrusion part, and the hook comprises a stopper surface facing the second end.

7. The head-mounted display device according to claim 1, wherein the base comprises a base part comprising a through hole, and the belt body is disposed through the through hole, and the belt body comprises a plurality of protruding ribs on an outer surface, wherein a sliding groove is formed in the through hole corresponding to an arrangement direction of the protruding ribs and a bump is disposed on a bottom surface of the sliding groove.

8. The head-mounted display device according to claim 7, wherein the protruding ribs on the outer surface of the belt body are aligned at equal intervals, and when the base is adapted to slide relative to the belt body, the protruding ribs is adapted to move in the sliding groove.

9. The head-mounted display device according to claim 8, wherein when the base is adapted to stop sliding, the bump is adapted to be limited by the two adjacent protruding ribs and positioned between the two protruding ribs, such that the base is adapted to be positioned on the belt body.

10. The head-mounted display device according to claim 1, wherein the head-mounted display device comprises two buckle assemblies to be disposed on two opposite sides of the belt body and two covers of the two buckle assemblies are adapted to be detachably disposed on two bases, and the at least one electronic module further comprises a lens module, wherein the display module and the lens module are fixed to the two covers respectively.

11. The head-mounted display device according to claim 1, wherein the belt body is a rigid body or a soft body, and the soft body is adapted to be installed on a helmet.

12. The head-mounted display device according to claim 1, further comprising:
a control box comprising a control circuit and being electrically connected with the at least one electronic module.

* * * * *